(12) United States Patent
Kawaguchi et al.

(10) Patent No.: US 8,941,524 B2
(45) Date of Patent: Jan. 27, 2015

(54) TD CONVERTER AND AD CONVERTER WITH NO OPERATIONAL AMPLIFIER AND NO SWITCHED CAPACITOR

(71) Applicant: Semiconductor Technology Academic Research Center, Kanagawa (JP)

(72) Inventors: Hiroshi Kawaguchi, Hyogo (JP); Masahiko Yoshimoto, Hyogo (JP); Toshihiro Konishi, Hyogo (JP); Shintaro Izumi, Hyogo (JP); Keisuke Okuno, Hyogo (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 13/874,531

(22) Filed: May 1, 2013

(65) Prior Publication Data

US 2013/0307713 A1 Nov. 21, 2013

(30) Foreign Application Priority Data

May 19, 2012 (JP) ................................ P2012-115133
Sep. 14, 2012 (JP) ................................ P2012-203662

(51) Int. Cl.
*H03M 1/50* (2006.01)
*G04F 10/00* (2006.01)

(52) U.S. Cl.
CPC .............. *H03M 1/50* (2013.01); *G04F 10/005* (2013.01)
USPC .......................................... 341/166; 341/155

(58) Field of Classification Search
CPC .......... H03M 1/12; H03M 1/50; H03M 1/502

USPC .................................................. 341/155, 166
See application file for complete search history.

(56) References Cited

U.S. PATENT DOCUMENTS 6,754,613 B2 * 6/2004 Tabatabaei et al. ........... 702/189
7,872,602 B2 * 1/2011 Chen ............................ 341/166
(Continued)

FOREIGN PATENT DOCUMENTS

JP 2011-108910 6/2011

OTHER PUBLICATIONS

F. Brandonisio, M. P. Kennedy, F. Maloberti, "Observations on the Resolution and Tones in First Order Noise Shaping Time-to-Digital Converters", Ph.D. Research in Microelectronics and Electronics (PRIME), 2011 7th Conference on, IEEE, Jul. 2011, pp. 17-20.
(Continued)

*Primary Examiner* — Brian Young
(74) *Attorney, Agent, or Firm* — Wenderoth, Lind & Ponack, L.L.P.

(57) ABSTRACT

A TD converter is provided for digitally converting a delay time value into a digital value. In the TD converter, an oscillator circuit part inputs time domain data. A first-state counter circuit part measures a number of waves of an output oscillation waveform from the oscillator circuit part when time domain data is in a first state, and a second-state counter circuit part measures a number of waves of the output oscillation waveform from the oscillator circuit part when the time domain data is in a second state. An output signal generator part generates an output signal based on output count values of the first-state counter circuit part and the second-state counter circuit part, and a frequency control circuit controls the oscillator circuit part to always oscillate and to control an oscillation frequency of the oscillator circuit part.

11 Claims, 15 Drawing Sheets

(56) References Cited

U.S. PATENT DOCUMENTS 8,325,076 B2 * 12/2012 Yousif et al. .................. 341/166
8,669,794 B2 * 3/2014 Park et al. ..................... 327/156

OTHER PUBLICATIONS

Y. Cao, P. Leroux, W. D. Cock, M. Steyaert, "A 1.7mW 11b 1-1-1 MASH $\Delta\Sigma$ Time-to-Digital Converter", Solid-State Circuits Conference Digest of Technical Papers (ISSCC), 2011 IEEE International, Feb. 23, 2011, pp. 480-482.

"A Multi-Path Gated Ring Oscillator TDC With First-Order Noise Shaping", M. Z. Straayer, et al, IEEE Journal of Solid-State Circuits, vol. 44, No. 4, pp. 1089-1098, Apr. 2009.

"A 40-nm 640- $\mu m^2$ 45-dB Opampless all-digital second-order MASH $\Delta\Sigma$ ADC", T. Konishi, H. Lee, S. Izumi, M. Yoshimoto, and H. Kawaguchi, IEEE ISCAS, pp. 518-521, May 2011.

* cited by examiner

TD CONVERTER AND AD CONVERTER WITH NO OPERATIONAL AMPLIFIER AND NO SWITCHED CAPACITOR

BACKGROUND OF THE INVENTION

1. Field of the Invention

The present invention relates to a TD (Time to Digital) converter that uses calculation in a time domain instead of using neither operational amplifier nor switched capacitor regarded as unsuitable for process scale shrinkage.

2. Description of the Related Art

It is indispensable to develop an LSI that has lower power consumption, higher performance and lower cost than conventional ones for further development of information communication equipment. The performances of conventional LSIs have been improved in accordance with the scale shrinkage of semiconductor manufacturing processes. The mounted transistor count per chip increases every year by virtue of scale shrinkage, and this allows higher performance LSIs to be actualized.

However, the scale shrinkage becomes difficult due to dynamic range and the problem of nonlinearity in the analog circuits such as operational amplifiers and switched capacitors. In particular, under environments of low power voltages in the advanced processes, the dynamic range narrows and the linearity deteriorates, and this leads to difficulties in securing gain.

In recent years, a technology to shift calculations from the voltage domain to the time domain has been researched to perform AD (Analog to Digital) conversion without using analog elements such as operational amplifiers and capacitors for adaptation to scale shrinkage. As a technology to digitize time domain data, a Time-to-Digital Converter (TDC=TD converter) to digitally convert a delay value into a digital value has been known to those skilled in the art.

In view of the fact that a Gated-Ring-Oscillator TDC (hereinafter, referred to as a "GRO TDC") utilizing a ring oscillator can obtain only first-order noise-shaping (See the Non-Patent Document 1), the present inventors have proposed operational-amplifier-less capacitor-less AD converter and TD converter capable of propagating quantization error in the time domain when taking advantage of the first-order noise-shaping characteristic of $\Delta\text{-}\Sigma$ modulation and performing higher-order noise-shaping (See the Patent Document 1 and the Non-Patent Document 2).

This is described hereinbelow. FIG. 19 shows a circuit configuration diagram of a GRO TDC. In the GRO TDC circuit, a pulse ($T_{in}$) is inputted as analog data changing temporally to a GRO (Gated-Ring-Oscillator), the inputted analog pulse width is quantized by counting the oscillation waveform of the GRO during the pulse width, and discretized digital data can be obtained. The present inventors paid attention to the first-order $\Delta\text{-}\Sigma$ type noise-shaping characteristic owned by the GRO TDC, and proposed an operational-amplifier-less capacitor-less AD converter capable of performing second-order noise-shaping (See FIG. 20). The proposed AD converter actualizes a second-order $\Delta\text{-}\Sigma$ modulator by employing a GRO TDC as a $\Delta\text{-}\Sigma$ modulator, a counter as a quantizer, and a D flip-flop as a circuit to propagate quantization error. The AD converter shown in FIG. 20 is configured to include a VT converter circuit part 14, a two-stage GRO 11 for inputting time domain data, a D flip-flop 12 that is inserted between the GRO 11 of the preceding stage and the GRO 11 of the succeeding stage and operates as a propagation circuit of delay information including the quantization error of the GRO 11 of the preceding stage, a counter 13 that counts the number of waves of the output oscillation waveforms ($GRO_{out1}$ and $GRO_{out2}$) from the GRO 11, a DSP (Digital Signal Processor) 15 that operates as an output signal generator part to generate an output signal based on the output count values ($D_{out1}$ and $D_{out2}$) from the counter 13, a reset part 17 configured to reset the D flip-flop 12 and two counter circuit parts 13 in response to a sampling clock (CK), and a calibration circuit 16 that performs nonlinear correction after a decimation filter process by the DSP 15.

In the above circuit configuration, the quantization error is included in the output oscillation waveform of the GRO 11, and the rise of an output oscillation waveform ($GRO_{out1}$) from the GRO of the preceding stage is detected by the D flip-flop 12 to obtain data ($T_{QN1}$) that includes the quantization error (QN). Subsequently, by performing subtraction of only the value ($D_{out1}$) of counting oscillation in the DSP 15, the quantization error can be transmitted.

In the above circuit configuration, the gating operation (turning on and off of $T_{in}$ and $T_{QN1}$) of the GRO 11 adversely affects the internal phase information as switching noises. Moreover, the phase information is influenced by leakage currents of the transistors. Since the leakage currents tend to increase as the process scale shrinkage advances, the above circuit configuration is unsuitable for scale shrinkage.

The present inventors discovered such a problem that the phase information when the GRO 11 stops is not completely retained since the data of the retained quantization error deteriorates due to the influence of the leakage currents through the minute processes in the GRO 11 according to the results of analysis of the circuit operation of the GRO TDC.

Moreover, the present inventors discovered such a problem that the quantization error becomes nonlinear in the circuit in which the D flip-flop 12 is singly employed as the circuit to propagate the quantization error according to the results of analysis of the circuit operation of the GRO TDC.

Further, it was discovered that the noise-shaping effect is weakened by frequency mismatch between the GROs 11 of respective stages.

These problems become obstructions in increasing the resolutions of the TD converter and the AD converter.

Prior art documents which are related to the present invention are as follows:

Patent Document 1: Japanese patent laid-open publication No. JP 2011-108910 A;

Non-Patent Document 1: "A Multi-Path Gated Ring Oscillator TDC With First-Order Noise Shaping", M. Z. Straayer, et al, IEEE Journal of Solid-state Circuits, Vol. 44, No. 4, pp. 1089-1098, April 2009; and Non-Patent Document 2: "A 40-nm 640-$\mu m^2$ 45-dB Opamp-less all-digital second-order MASH $\Delta\Sigma$ ADC", T. Konishi, H. Lee, S. Izumi, M. Yoshimoto, and H. Kawaguchi, IEEE ISCAS, pp. 518-521, May 2011.

As described above, the GRO TDC proposed by the present inventors, i.e., the operational-amplifier-less capacitor-less TD converter capable of performing higher-order noise-shaping by propagating the quantization error has such a problem that it easily receives influences on the gating operation of the GRO, the phase information when the GRO stops cannot be completely retained due to the influences of leakage currents, and the circuit to propagate the quantization error is nonlinear.

SUMMARY OF THE INVENTION

In view of the aforementioned circumstances, the present invention has a first object to provide a high-resolution operational-amplifier-less capacitor-less TD converter, whose switching noises are reduced by reducing the amount of currents that change at the time of the gating operation of the oscillator.

A second object of the present invention is to provide a high-resolution operational-amplifier-less capacitor-less TD converter, which scarcely receives the influences of leakage currents by obviating the need for statically retaining the phase information by means of stopping the oscillator.

A third object of the present invention is to provide an operational-amplifier-less capacitor-less higher-order TD converter, which can perform higher-order noise shaping by propagating the quantization error by improving the linearity of the circuit that propagates the quantization error.

Further, a fourth object of the present invention is to provide an operational-amplifier-less capacitor-less higher-order TD converter, which can perform higher-order noise-shaping by correcting the frequency mismatch between the oscillators of respective stages by an adaptive filter.

In order to achieve the aforementioned objects, the TD converter of the present invention is provided for digitally converting delay time values into a digital value, using the following items (1) to (3), and the TD converter includes a frequency control circuit capable of making the oscillator always oscillate and controlling the oscillation frequency of the oscillator circuit part of the item (1):

(1) An oscillator circuit part is configured to input time domain data;

(2) A first-state counter circuit part is configured to measure the number of output oscillation waveforms of the oscillator circuit part for a time interval when the time domain data is in a first state, and a second-state counter circuit part is configured to measure the number of output oscillation waveforms of the oscillator circuit part for a time interval when the time domain data is in a second state; and (3) An output signal generator part is configured to generate an output signal based on output count values of the first-state counter circuit part and the second-state counter circuit part.

According to the above configuration, a high-resolution operational-amplifier-less capacitor-less TD converter that has small switching noises and obviates the need for statically retaining the phase information can be actualized.

The first-state counter circuit part and the second-state counter circuit part described above are the circuits that, when an analog pulse-width input changing temporally is inputted to the oscillator circuit part, count the output oscillation waveform of the oscillator circuit part existing for a time interval when the pulse is in the first state or the second state, quantize the inputted analog pulse-width, and obtain discretized digital data.

Moreover, in order to achieve the aforementioned objects, the TD converter of the present invention includes an error propagation circuit part, which is inserted between the oscillator circuit part of the preceding stage and the oscillator circuit part of the succeeding stage by interlinking a plurality of M stages of TD converters as cascade, takes out delay information including the quantization error from the phase information of the oscillator circuit part of the preceding stage, and propagates the information as time domain data to the oscillator circuit part of the succeeding stage, and an output signal generator part, which generates an output signal based on the output count values from the first-state counter circuit part of each stage and the second-state counter circuit part of each stage.

According to the above configuration, an operational-amplifier-less capacitor-less higher-order TD converter capable of propagating the quantization error and correcting the frequency mismatch between the oscillators of respective adjacent stages can be actualized.

In the time domain data described above, the first state is the state in which the time domain data is in the High state, and the second state is the state in which the time domain data is in the Low state. The High state and the Low state correspond to the "Truth" and "False" or "ON" and "OFF", respectively.

Moreover, the aforementioned output signal generator part is to generate an output signal by calculating operation of the output count values of the first-state counter circuit part of each stage and the second-state counter circuit part of each stage, and processes the values by a DSP (Digital Signal Processor) or the like.

The frequency control circuit in the TD converter of the present invention should preferably control the frequency of oscillator in two modes.

Moreover, the oscillator circuit part in the TD converter of the present invention is configured to include a ring oscillator circuit, and the frequency control circuit should preferably have a configuration in which two current sources are connected in parallel through a multiplexer with the ring oscillator circuit, one current source is always connected through the multiplexer, and another current source is connected through the multiplexer when the time domain data is inputted.

The ring oscillator circuit is more concretely configured to include an FSO (Frequency Shift Oscillator) circuit. The FSO circuit includes a ring oscillator configured to include an inverter and a variable current source connected to power lines on the VDD side and the GND side. The ring oscillator employs an odd number of inverters, and has such a configuration that the output of each inverter is connected in a chain style to another inverter, and the output of the inverter of the final stage is inputted to the inverter of the first stage, forming a ring structure as a whole. The chain of the odd number of inverters serves as the logical negation of the input as a whole. Since each inverter has a constant delay time, the inverter of the final stage outputs the logical negation of the input to the first stage after a definite delay time from the input to the inverter of the first stage. Then, this is inputted again to the inverter of the first stage. By repeating these processes, oscillation occurs. The oscillation speed is determined by the amount of current flowing to each inverter, an output of each inverter, and an input load capacitance. The FSO circuit controls the oscillation frequency by changing the amount of current by the variable current source. By employing the FSO circuit, the noise-shaping characteristic of $\Delta$-$\Sigma$ modulation can be utilized.

Moreover, the error propagation circuit part in the higher-order TD converter of the present invention should preferably have a circuit configuration in which dynamic type D flip-flop circuits of at least two stages are interlinked or connected in cascade.

By connecting between oscillator circuit parts by the circuit in which dynamic type D flip-flop circuits of at least two stages are interlinked or connected in cascade, the influence of malfunction (Meta stable) occurring in the dynamic type D flip-flop circuit can be completely suppressed, and transmission of accurate time domain data is possible.

Moreover, the output signal generator part in the higher-order TD converter of the present invention should preferably have an LMS (Least Mean Square) filter circuit, which is mounted to estimate an oscillation frequency ratio between the stages of the oscillator circuit parts based on the output count values of the first-state counter circuit part of each stage and the second-state counter circuit part of each stage.

By employing the LMS filter, it is possible to estimate the oscillation frequency ratio between the oscillator circuit parts of adjacent stages based on the first-state count value of each stage and the second-state count value of each stage, detect the frequency mismatch, and dynamically correct the mismatch. This is to correct the frequency mismatch of the oscillator circuit parts, which emerges as a problem when developed to a higher-order noise-shaping circuit, in the digital domain.

The AD converter of the present invention includes a VT converter circuit configured to input an analog input voltage and a sampling clock (CK), convert the analog input voltage to corresponding delay time, and output time domain data, and the aforementioned TD converter configured to input the time domain data outputted from the VT converter circuit part.

As an application range of the aforementioned TD converter, it is possible to utilize it as an AD converter by adding a digital PLL and a VT converter. When used as an AD converter, it is very effective for combined analog/digital chips in the minute processes because of its architecture of higher affinity to digital structures, and able to be mounted at low cost since operational amplifiers and capacitors occupying large areas can be removed.

In this case, the aforementioned VT converter circuit part is the circuit that employs no operational amplifier of large power consumption, and performs VT (Voltage to Time) conversion of data from the voltage domain to the time domain in order to perform calculations by converting a voltage value into a delay (time) value.

According to the present invention, there are such an action and effects that the operational-amplifier-less capacitor-less TD converter can be configured, which has small switching noises, obviates the need for statically retaining the phase information, propagates the quantization error with high linearity, and the capabilities of correcting the frequency mismatch between the oscillators and performing higher-order noise-shaping in the time domain.

According to the TD converter and the AD converter of the present invention, which are configured to include oscillator circuits and logic circuits, it is possible to provide a configuration of a small area and low power consumption, and suitable for minute processes.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Preferred embodiments of the present invention will be described in detail below with reference to the drawings. It is noted that the scope of the present invention is not limited to the following preferred embodiments and illustrative examples but allowed to be altered and modified in various manners.

In the first-order TD converters of the following preferred embodiments, the first state of the time domain data is assumed to be "High", and the second state is assumed to be "Low". Moreover, a High counter circuit part is provided as a first-state counter circuit part, and a Low counter circuit part is provided as a second-state counter circuit part. In this case, the "High" state of the time domain data corresponds to the "Truth" of the logical value, and the "Low" state of the time domain data corresponds to the "False" of the logical value.

As another preferred embodiment, it is acceptable that the time interval from the rising edge of one of two signal lines to the rising edge of another may be set to be "ON" and the other case may be set to "OFF", instead of inputting the time domain data of one signal by the rule that High="ON" and Low="OFF".

First Preferred Embodiment

Figure 1:
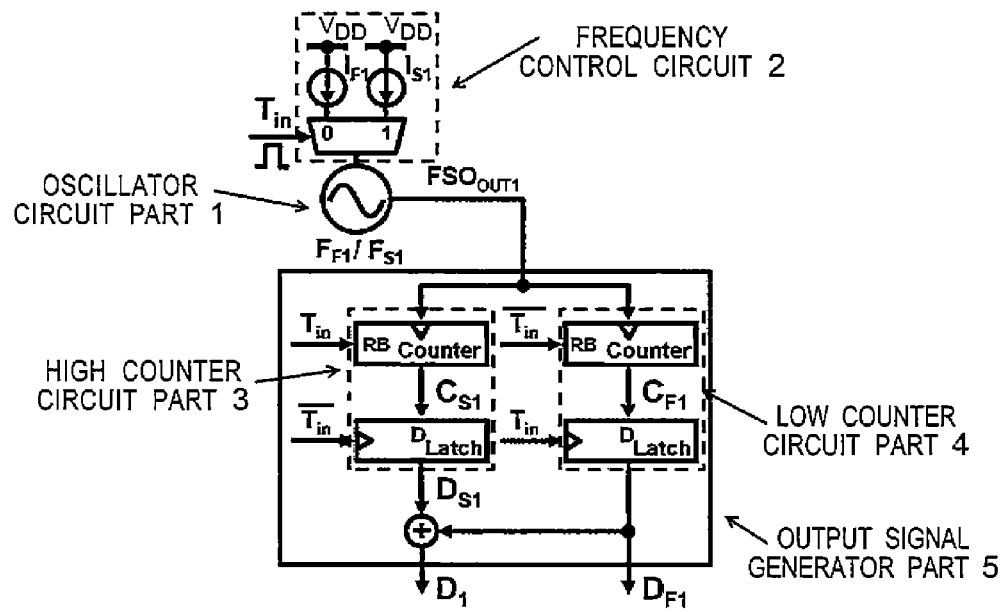
FIG. 1 is a circuit configuration diagram of a first-order TD converter of a first preferred embodiment.

FIG. 1 shows a circuit configuration diagram of the first-order TD converter of the first preferred embodiment.

The first-order TD converter of the first preferred embodiment is configured to include: a one-stage oscillator circuit part configured to input time domain data ($T_{in}$); a High counter circuit part that includes a High counter configured to measure the number of waves of the output oscillation waveform from the oscillator circuit part when the time domain data is "High" and a High register configured to store the number of waves when the time domain data is "High" at the preceding sampling; a Low counter circuit part that includes a Low counter configured to measure the number of waves of the output oscillation waveform of the oscillator circuit part when the time domain data is "Low" and a Low register configured to store the number of waves when the time domain data is "Low" at the preceding sampling; an adder configured to add a High register value to a Low register value; and a frequency control circuit capable of controlling the oscillator circuit part to always oscillate and controlling its oscillation frequency.

The first-order TD converter of the first preferred embodiment includes the one-stage oscillator circuit part configured to input the time domain data ($T_{in}$), the High counter circuit part configured to measure the number of waves of the output oscillation waveform from the oscillator circuit part when the time domain data is "High", the Low counter circuit part configured to measure the number of waves of the output oscillation waveform from the oscillator circuit part when the time domain data is "Low", an output signal generator part configured to generate an output signal based on the output count values of the High counter circuit part and the Low counter circuit part, and the frequency control circuit capable of controlling the oscillator circuit part to always oscillate and controlling its oscillation frequency.

In concrete, the High counter circuit part is configured to include the High counter configured to measure the number of waves of the output oscillation waveform from the oscillator circuit part when the time domain data is "High", and the High register configured to store the number of waves when the time domain data is "High" at the preceding sampling. Moreover, the Low counter circuit part is configured to include the Low counter configured to measure the number of waves of the output oscillation waveform from the oscillator circuit part when the time domain data is "Low", and the Low register configured to store the number of waves when the time domain data is "Low" at the preceding sampling. Then, the adder to add the High register value to the Low register value generates a digital output signal.

Referring to FIG. 1, the first-order TD converter of the first preferred embodiment is configured to include a ring oscillator circuit having two output frequencies, or the aforementioned FSO (Frequency Shift Oscillator), where the oscillation frequency changes in the oscillator circuit part when the analog pulse ($T_{in}$) is inputted as time domain data.

Figure 2:
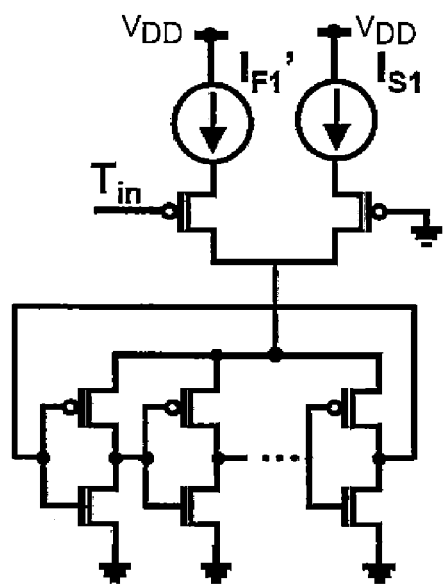
FIG. 2 is a circuit configuration diagram of a frequency control circuit of the first preferred embodiment.

In the frequency control circuit, as shown in FIG. 2, two current sources are connected parallel through a multiplexer to the ring oscillator circuit. One current source is always connected, and the other current source is connected when the time domain data is inputted (concretely, when $T_{in}$=Low then I=$I_{F1}$'+$I_{S1}$+$I_{S1}$, but I=$I_{S1}$ when $T_{in}$=High). The ring oscillator circuit part can be controlled to always oscillate by the frequency control circuit shown in FIG. 2, and the oscillation frequency can be controlled in two modes. Moreover, the amount of current that changes at the time of frequency control can be reduced unlike the GRO. In contrast to the GRO where high-speed oscillation and zero oscillation are repeated, high-speed oscillation and medium-speed oscillation are repeated in the FSO. Therefore, the amount of changing current is small, and the power switching noises can be reduced.

In the first-order TD converter of the first preferred embodiment, the phase needs not be statically retained unlike the GRO.

These matters will be described in detail below showing examples of the circuit operation of the first-order TD converter of the first preferred embodiment.

Figure 3:
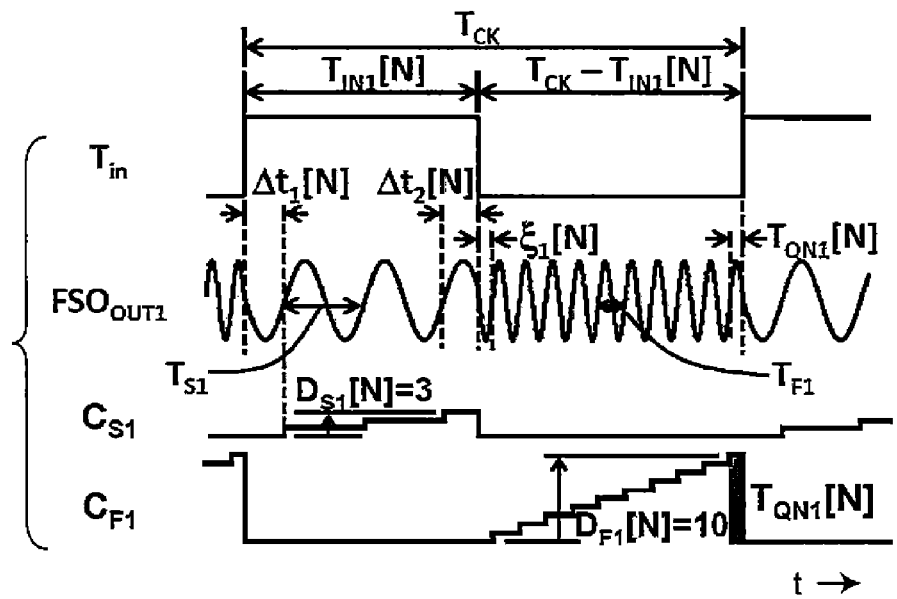
FIG. 3 is a schematic chart of waveforms when the first-order TD converter of the first preferred embodiment operates.

FIG. 3 is a schematic chart of the waveforms of the oscillator circuit when the first-order TD converter operates. The symbol $T_{in}$ in FIG. 3 denotes time domain data, $T_{CK}$ denotes a sampling period, and $T_{IN1}[N]$ denotes a pulse-width of the input time domain data at the N-th sampling. Further, $T_{S1}$ denotes an oscillation period of the oscillator when the input time domain data is "High", and $T_{F1}$ denotes an oscillation period of the oscillator when the input time domain data is "Low". Further, $\Delta t_1[N]$ denotes a time interval from the rise of the input time domain data at the N-th sampling to the first rise time of the oscillator circuit part, and $\Delta t_2[N]$ denotes a time interval from the last rise of the oscillator circuit part when the input time domain data at the N-th sampling is "High" to the fall of the input time domain data. Moreover, $\xi_1[N]$ denotes a time interval from the fall of the input time domain data at the N-th sampling to the last rise of the oscillator circuit part, and $T_{QN1}[N]$ denotes a time interval from the last rise of the oscillator circuit part when the input time domain data at the N-th sampling is "Low" to the rise of the input time domain data. Furthermore, $D_{S1}[N]$ denotes a count value (High count value) of the oscillator circuit part when the input time domain data at the N-th sampling is "High", and $D_{F1}[N]$ denotes a count value (Low count value) of the oscillator circuit part when the input time domain data at the N-th sampling is "Low". The Equations (1) to (4) are derived from FIG. 3.

According to the schematic chart of the waveforms shown in FIG. 3, $T_{IN1}[N]$ and $T_{CK}$-$T_{IN1}[N]$ can be expressed by using the following Equations (1) and (2), respectively. Moreover, $\Delta t_1[N]$ and $T_{QN1}[N-1]$, and $\Delta t_2[N]$ and $\xi_1[N]$ can be expressed by using the following Equations (3) and (4), respectively:

$$T_{IN1}[N] = \Delta t_1[N] + T_{S1}(D_{S1}[N]-1) + \Delta t_2[N] \tag{1}$$

$$T_{CK} - T_{IN1}[N] = \xi_1[N] + T_{F1}(D_{F1}[N]-1) + T_{QN1}[N] \tag{2}$$

$$\Delta t_1[N]/T_{S1} + T_{QN1}[N-1]/T_{F1} = 1 \tag{3}$$

$$\Delta t_2[N]/T_{S1} + \xi_1[N]/T_{F1} = 1 \tag{4}$$

Moreover, $D_{F1}[N]$ and a number of total oscillations $D_1[N]$ of the oscillator circuit part during one sampling period are expressed by the following Equations (5) and (6), respectively. In the following Equations (5) and (6), $C_1$ and $C_2$ denote constants:

$$D_{F1}[N] = -T_{IN1}[N]/T_{F1} - T_{QN1}[N]/T_{F1} - \xi_1[N]/T_{F1} + C_1, \text{ and} \tag{5}$$

$$\begin{aligned}D_1[N] &= D_{S1}[N] + D_{F1}[N] \\ &= (1/T_{S1} - 1/T_{F1})T_{IN1}[N] - (T_{QN1}[N] - \\ &\quad T_{QN1}[N-1])/T_{F1} + C_2.\end{aligned} \tag{6}$$

In this case, assuming that $A_1 = 1/T_{S1} - 1/T_{F1}$ and $B_1 = 1/T_{F1}$ by introducing a Z function into the Equations (5) and (6), then the following Equations (5) and (6) can be expressed as the following Equations (7) and (8), respectively:

$$D_{F1} = -B_1 T_{IN1} - B_1 T_{QN1} - B_1 \xi_1 + C_1 \tag{7}$$

$$D_1 = A_1 T_{IN1} - B_1(1-z^{-1})T_{QN1} + C_2 \tag{8}$$

The aforementioned Equation (8) indicates that the time domain data is subjected to first-order noise shaping.

Figure 4:
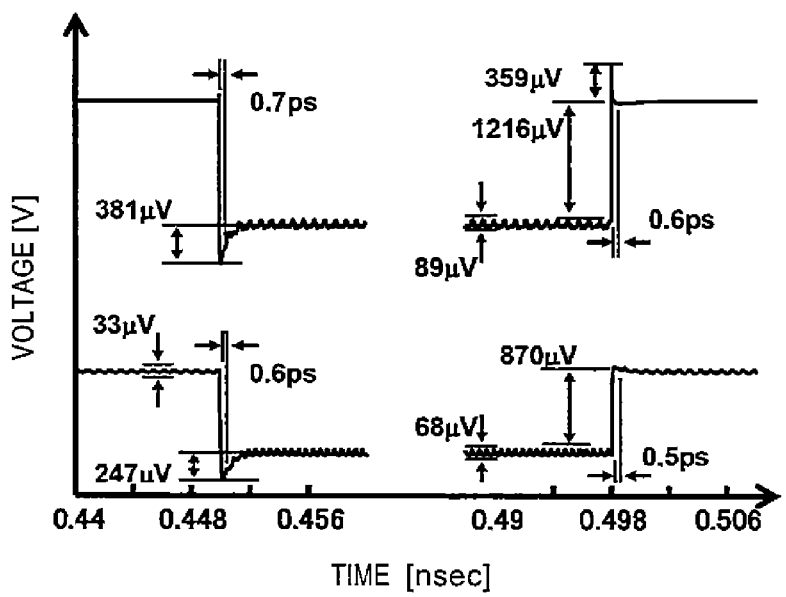
FIG. 4 shows influences of noises on a power line.
Figure 19:
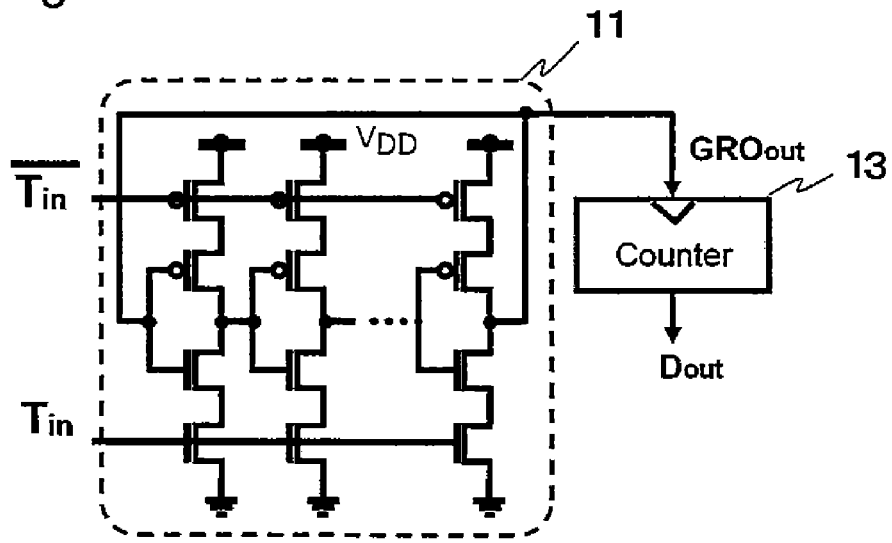
FIG. 19 is a circuit configuration diagram of a GRO TDC.
Figure 20:
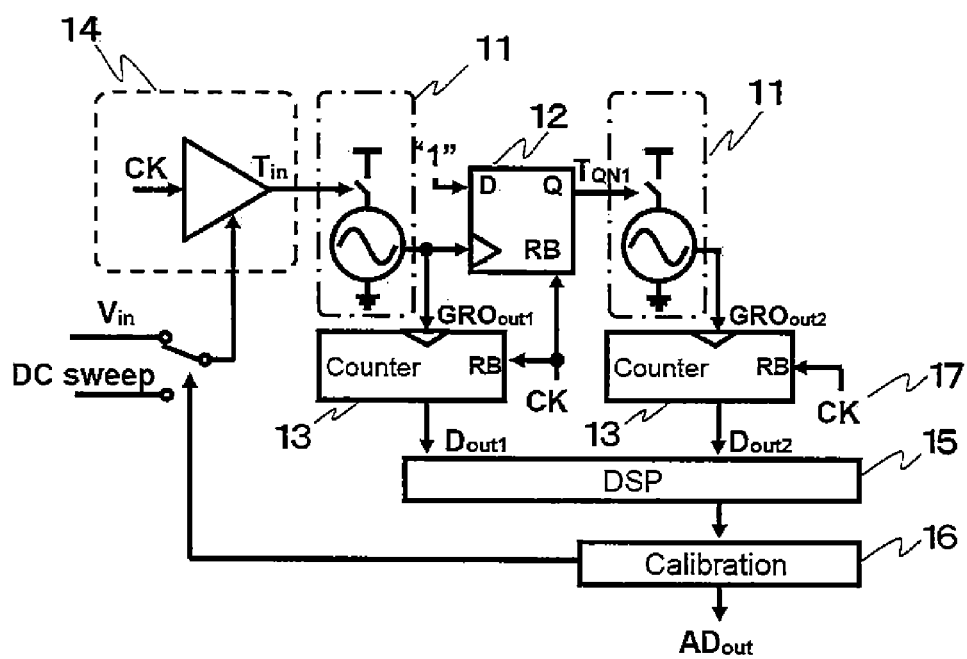
FIG. 20 is a circuit configuration diagram of already proposed AD converter.

FIG. 4 shows influences of noises on the power line when a GRO TDC is employed and when the first-order FRO TDC of the first preferred embodiment is employed. The GRO TDC is shown in FIG. 19, and the first-order FRO TDC of the first preferred embodiment has the circuit configuration shown in FIG. 1. It is assumed that the power line of the oscillator has a decoupling capacitance of 1 pF, and a waveform appearing at both ends of the capacitance is plotted.

Referring to FIG. 4, it can be confirmed that the voltage change value in the case of the FRO of the first preferred embodiment located in the lower portion of the figure is smaller than the voltage change value of undershoot and overshoot at the switching time when the GRO located in the upper portion of the figure is employed. Moreover, it can be confirmed that the FRO of the first preferred embodiment has a higher speed with regard to voltage transition time. According to this fact, reductions of noises from the oscillator circuit itself can be expected.

Second Preferred Embodiment

Figure 5:
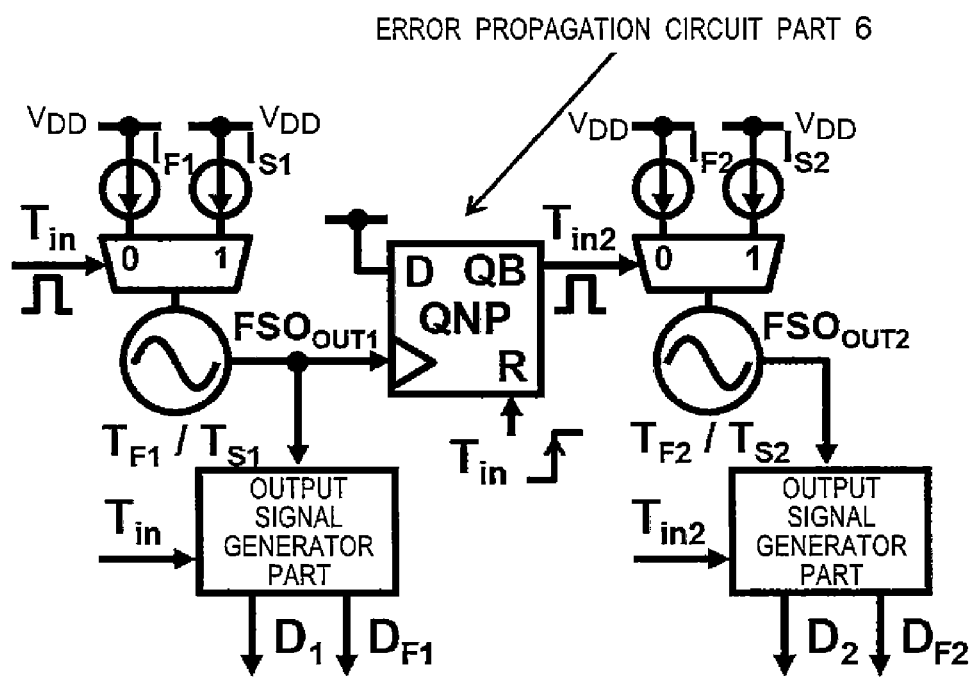
FIG. 5 is a circuit configuration diagram of a second-order TD converter of a second preferred embodiment.

FIG. 5 shows a circuit configuration diagram of a second-order TD converter of the second preferred embodiment.

The second-order TD converter of the second preferred embodiment is configured to include: a two-stage oscillator circuit part configured to input time domain data ($T_{in}$ and $T_{in2}$); an error propagation circuit part that is inserted between the oscillator circuit part of the preceding stage and the oscillator circuit part of the succeeding stage, takes out delay information including quantization error from the phase information of the oscillator circuit part of the preceding stage, and propagates the information as time domain data ($T_{in2}$) of the succeeding stage to the oscillator circuit part of the succeeding stage; a High counter circuit part that includes a High counter configured to measure the number of waves of the output oscillation waveform of the oscillator circuit part when the time domain data of each stage is "High" and a High register configured to store the number of waves when the time domain data of each stage is "High" at the preceding sampling; a Low counter circuit part that includes a Low counter configured to measure the number of waves of the output oscillation waveform of the oscillator circuit part when the time domain data of each stage is "Low" and a Low register configured to store the number of waves when the time domain data of each stage is "Low" at the preceding sampling; a signal output generator part to operationally calculate the High register value and the Low register value of each stage; and a frequency control circuit capable of controlling the oscillator circuit part always oscillate and controlling its oscillation frequency.

This is described in detail below when showing examples of the circuit operation of the second-order TD converter of the second preferred embodiment.

Figure 6:
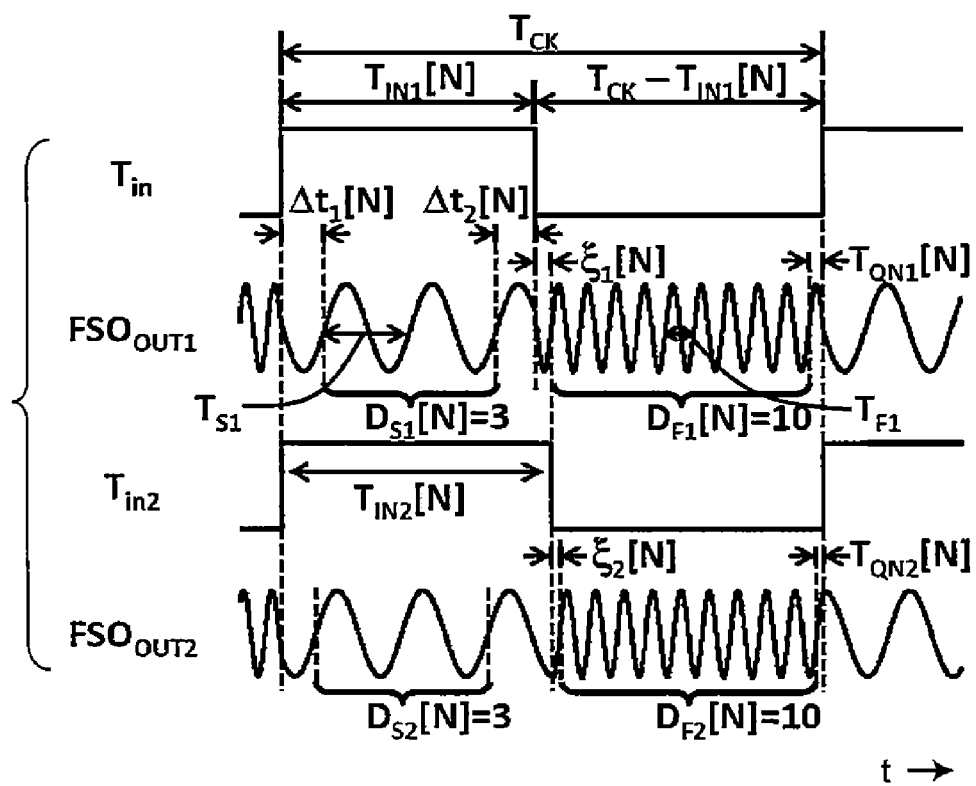
FIG. 6 is a schematic chart of waveforms when the second-order TD converter of the second preferred embodiment operates.

FIG. 6 is a schematic chart of the waveforms of the oscillator circuit when the second-order TD converter operates. The symbol $T_{in}$ in FIG. 6 denotes input time domain data, $T_{CK}$ denotes a sampling period, and $T_{IFi}[N]$ ("i"=1, 2) denotes a pulse-width of the time domain data at the N-th sampling in the i-th stage. Further, $T_{si}$ denotes an oscillation period of the oscillator when the time domain data in the i-th stage is "High", and $T_{Fi}$ denotes an oscillation period of the oscillator when the time domain data in the i-th stage is "Low". Further, $\Delta t_1[N]$ denotes a time interval from the rise of the input time domain data at the N-th sampling to the first rise of the oscillator circuit part, and $\Delta t_2[N]$ denotes a time interval from the last rise of the oscillator circuit part when the input time domain data at the N-th sampling is "High" to the fall of the input time domain data. Moreover, $\xi_1[N]$ denotes a time interval from the fall of the time domain data at the N-th sampling in the i-th stage to the first rise of the oscillator circuit part, and $T_{QNi}[N]$ is time from the last rise of the oscillator circuit part when the time domain data at the N-th sampling in the i-th stage is "Low" to the rise of the time domain data. Furthermore, $D_{Si}[N]$ denotes a count value (High count value) of the oscillator circuit part when the time domain data at the N-th sampling in the i-th stage is "High", and $D_{Fi}[N]$ denotes a count value (Low count value) of the oscillator circuit part when the time domain data at the N-th sampling in the i-th stage is "Low".

Also, with regard to the output of the second stage, the following Equations (9) and (10) can be obtained in a manner similar to that of the aforementioned Equations (7) and (8) of the first preferred embodiment. It is noted that $A_2=1/T_{S2}-1/T_{F2}$, and $B_2=1/T_{F2}$. In the following Equations (9) and (10), $C_3$ and $C_4$ are constants:

$$D_{F2}=-B_2T_{IN2}-B_2T_{QN2}-B_2\xi_2+C_3 \quad (9), \text{ and}$$

$$D_2=A_2T_{IN2}-B_2(1-z^{-1})T_{QN2}+C_4 \quad (10).$$

Moreover, since $T_{CK}-T_{IN2}=T_{F1}(D_{F1}-1)+T_{QN1}$, $T_{IN2}=-(D_{F1}-1)/B_1-T_{QN1}+T_{CK}$, and this is substituted into the aforementioned Equation (10) to obtain the following Equation (11). In the following Equation (11), $C_5$ is a constant:

$$D_2=-A_2(D_{F1}-1)/B_1-A_2T_{QN1}-B_2(1-z^{-1})T_{QN2}+C_5 \quad (11).$$

In the Equation (11), also $T_{IN2}=T_{IN1}+\xi_1$, and this is substituted into the aforementioned Equation (10) to obtain the following Equation (12):

$$D_2=A_2T_{IN1}-B_2(1-z^{-1})T_{QN2}+A_2\xi_1+C_4 \quad (12).$$

Figure 7:
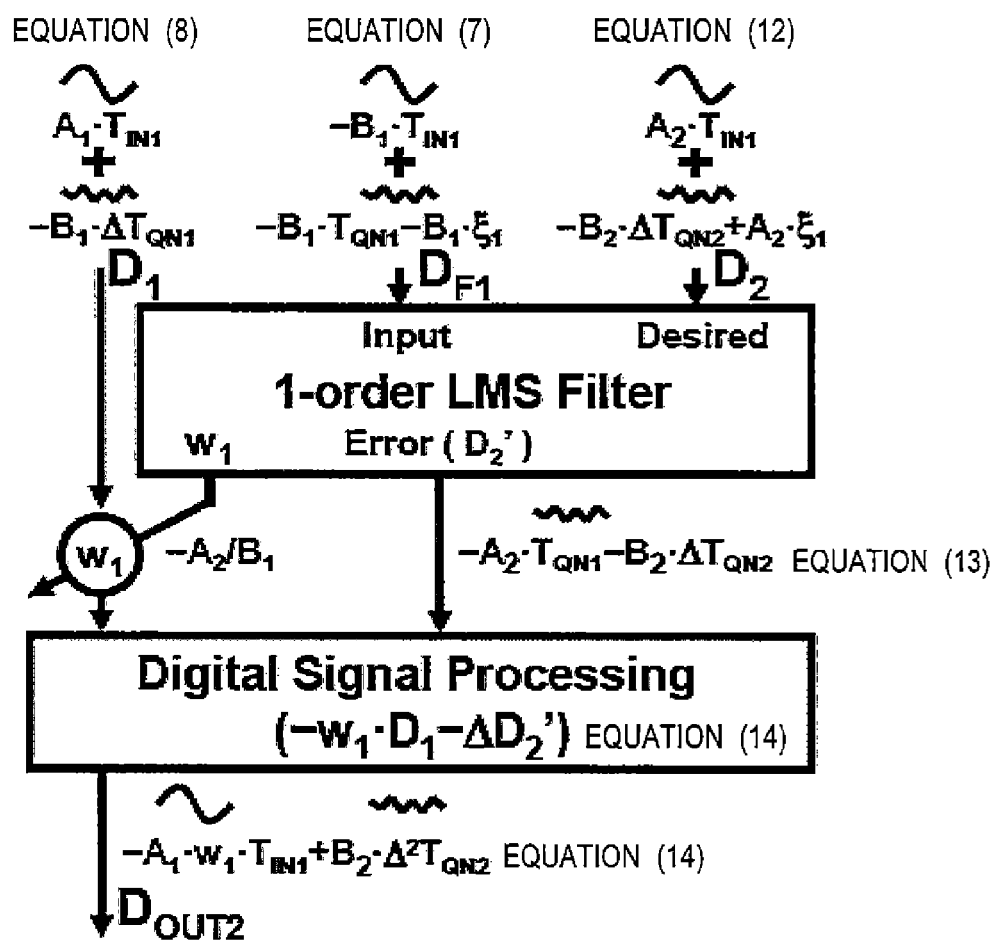
FIG. 7 is a conceptual diagram of an LMS filter circuit.

According to the aforementioned Equation (7) and $T_{IN1}$ of the aforementioned Equation (12), it is proper to obtain a coefficient ratio of $-A_2/B_1$ by the LMS filter. The following estimation method of $w_1$ is schematically written in FIG. 7.

If it is Herein Assumed that
$T_{IN1} \gg T_{QNi}$, and
$T_{IN1} \gg \xi_i$,
then the coefficient ratio to be estimated is $w_1=-A_2/B_1$.

According to the aforementioned Equation (11), the error $D_2'$ of the LMS filter can be expressed by the following Equation (13). Moreover, by utilizing the Equation (13), an output $D_{OUT2}$ obtained by subjecting the quantization error component to second-order noise shaping can be obtained as the following Equation (14). In the following Equations (13) and (14), $C_5$ and $C_7$ are constants:

$$D_2' = D_2 - w_1 D_{F1} \quad (13)$$
$$= -A_2 T_{QN1} - B_2(1-z^{-1})T_{QN2} + C_6, \text{ and}$$

$$D_{OUT2} = -w_1 D_1 - D_2'(1-z^{-1}) \quad (14)$$
$$= -A_1 w_1 T_{IN1} + B_2(1-z^{-1})^2 T_{QN2} + C_7.$$

The order of an adaptive filter needed for the circuit configuration of the second preferred embodiment is first order, and only one filter needs to be prepared, allowing the areal overhead to be suppressed low.

Figure 8:
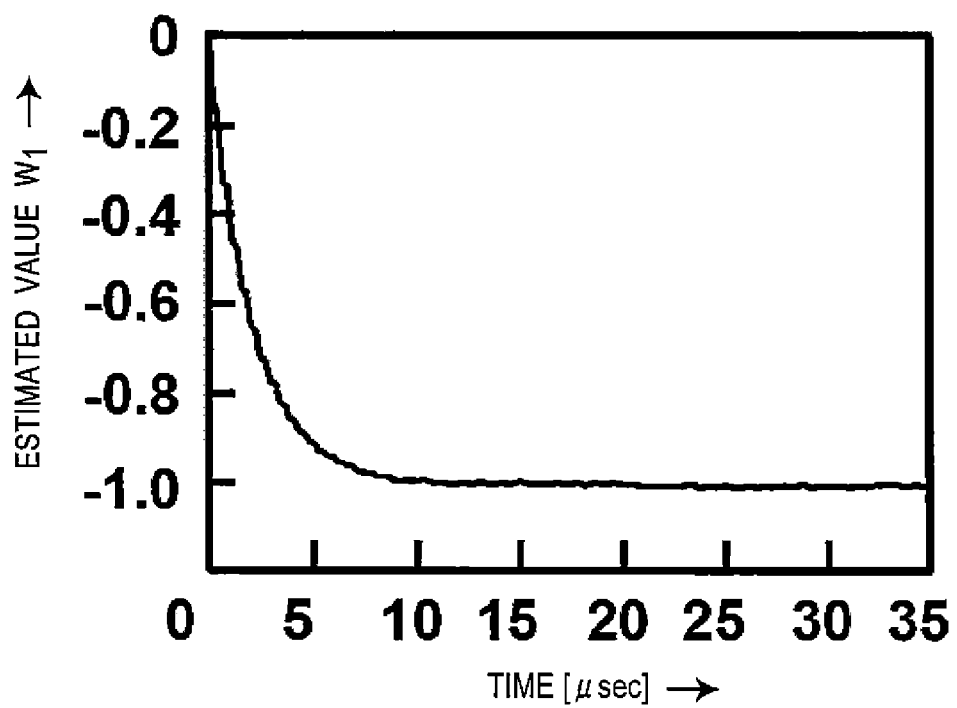
FIG. 8 is a graph showing a convergence of an estimation value by the LMS filter circuit.

Next, simulation results conducted by a circuit model of the second preferred embodiment mounted on numerical calculation software (MATLAB/Simulink) is shown in FIG. 8. It can be understood that convergence is achieved in about 10 µs, and the intended coefficient (ratio of oscillation frequency between the oscillator circuit parts of adjacent stages) can be estimated by the LMS (Least Mean Square) filter.

Figure 9:
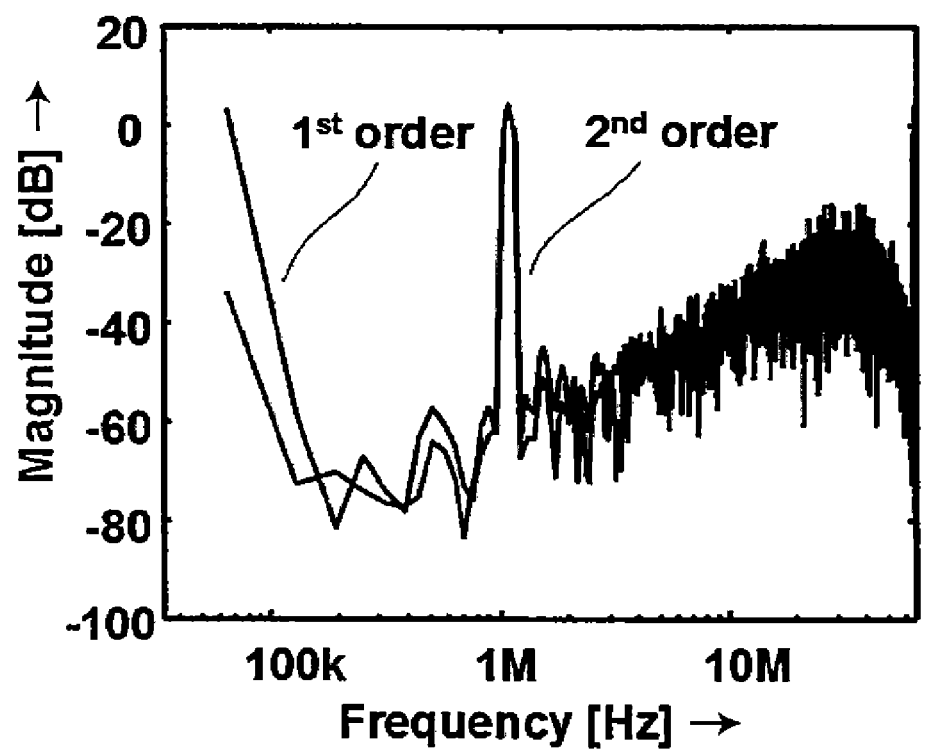
FIG. 9 shows comparison of output spectrums of the first-order TD converter and the second-order TD converter on which the LMS filter is mounted.

The convergence time can be adjusted by changing the step size of the LMS filter. The output spectrums of the first-order TD converter ($1^{st}$ order) of the first preferred embodiment and the second-order TD converter ($2^{nd}$ order) of the second preferred embodiment are shown in FIG. 9. Second-order noise-shaping effects can be confirmed. In this case, the input signal frequency was 1 (MHz), the signal amplitude was 1.9 (ns), and the sampling rate was 65 (MHz). In this case, the SNR of the output that has undergone first-order noise shaping is 44.9 (dB), and the SNR of the output that has undergone second-order noise shaping is 51.2 (dB).

Figure 10:
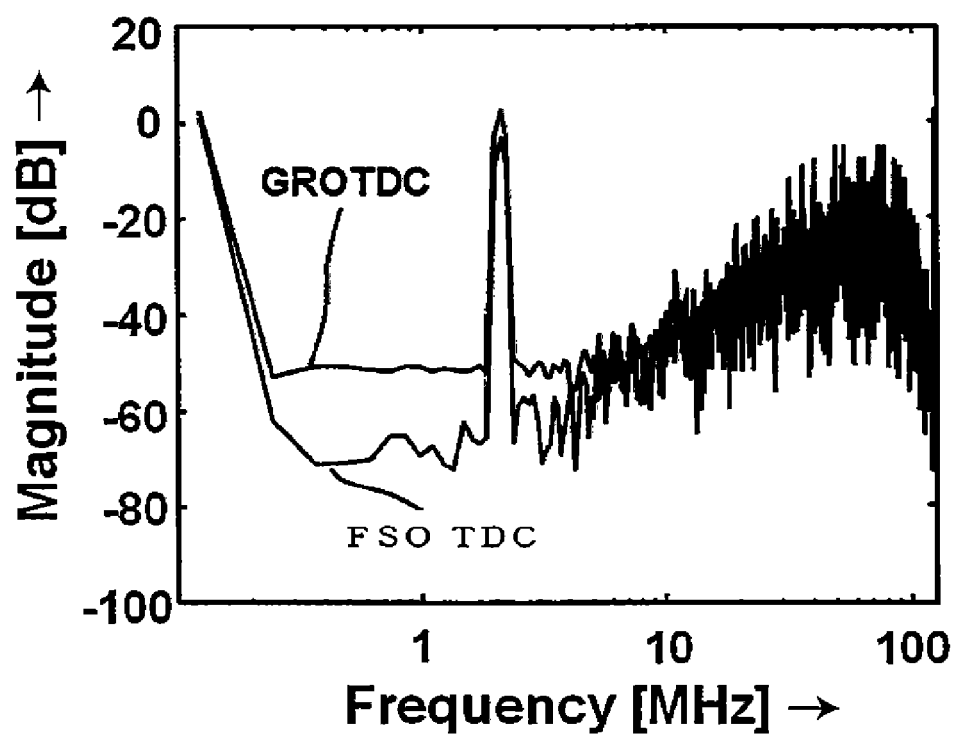
FIG. 10 shows comparison of output spectrums of a second-order GRO TDC and a second-order FSO TDC for which leakage currents are considered.

Further, simulations considering oscillator circuit leakage current were conducted by a second-order GRO TDC and the second-order FSO TDC of the second preferred embodiment mounted on the numerical calculation software (MATLAB/Simulink). The simulation results are shown in FIG. 10. According to the present simulations, it is assumed that a jitter of 1/1000 of the sampling period appears at the time of gating due to leakage currents. It can be understood that the noise floor rises in the case of the GRO TDC. On the same conditions, the noise-shaping effect is produced more deeply in the case of the FSO TDC of the second preferred embodiment, and it can be expected that the influence of the leakage is little.

Third Preferred Embodiment

Figure 11:
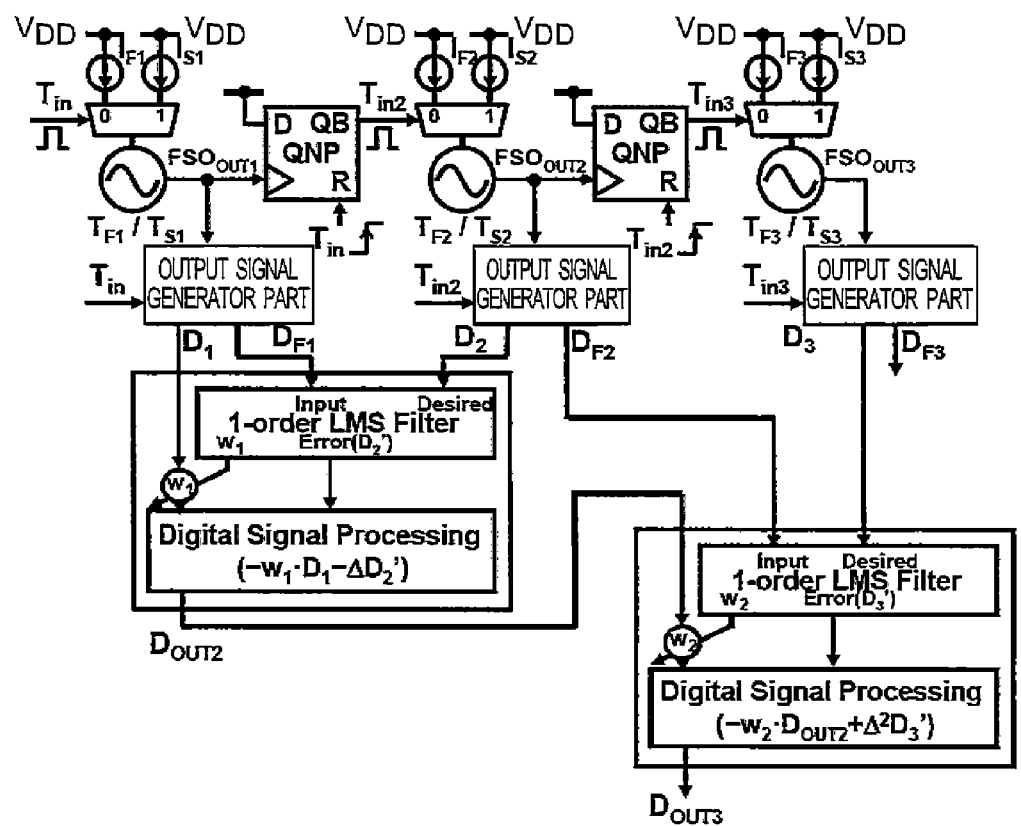
FIG. 11 is a circuit configuration diagram of a third-order TD converter of a third preferred embodiment.

FIG. 11 shows a circuit configuration diagram where the second-order TD converter of the second preferred embodiment is extended to the third-order TD converter of the third preferred embodiment.

Figure 12:
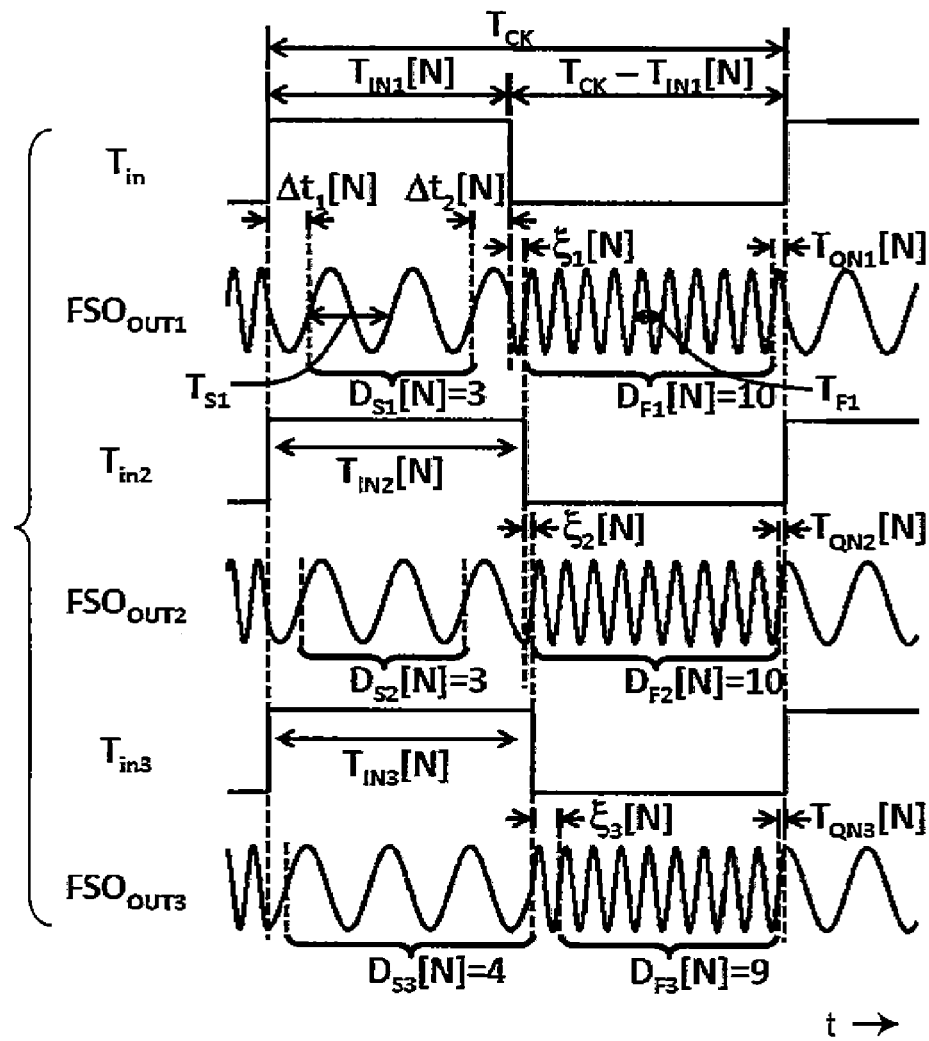
FIG. 12 is a schematic chart of waveforms when the third-order TD converter of the third preferred embodiment operates.

FIG. 12 is a schematic chart of the waveforms of the oscillator circuit when the third-order TD converter operates. A digital output $D_{OUT3}$ of which the quantization error has undergone third-order noise-shaping can be obtained as the following Equations (15) and (16) by estimating $w_2=-A_3/B_2$ in a manner similar to that of the second preferred embodiment except for the symbol "i"=1, 2, 3. It is also possible to extend it to a higher order. In the following Equations (15) and (16), $C_8$ and $C_9$ are constants:

$$D'_3 = D_3 - w_2 D_{F2} \qquad (15)$$
$$= -A_3 T_{QN2} - B_3(1-z^{-1})T_{QN3} + C_8, \text{ and}$$

$$D_{OUT3} = -w_2 D_{OUT2} + D'_3(1-z^{-1})^2 \qquad (16)$$
$$= A_1 w_1 w_2 T_{IN1} - B_3(1-z^{-1})^3 T_{QN3} + C_9.$$

Fourth Preferred Embodiment

In the fourth preferred embodiment, a circuit in which dynamic type D flip-flop circuits of two stages are connected together as a structural aspect of the error propagation circuit part in a higher-order TD converter is described.

Figure 13:
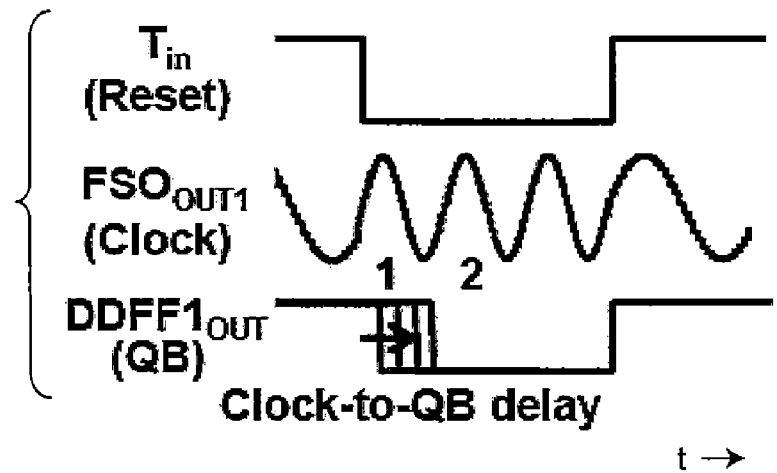
FIG. 13 is a timing diagram of an error propagation circuit part.

In order to perform higher-order noise shaping by propagating the quantization error, it is required to obtain the quantization error from the output waveform of the ring oscillator circuit of the first stage and transmit the error to the ring oscillator circuit of the succeeding stage. When an error propagation circuit part is configured by employing only one master-slave type D flip-flop circuit used normally, there is such a problem that a jitter attributed to malfunction (Meta stable) is disadvantageously generated in the time domain. This leads to the occurrence of malfunction (Meta stable) when the fall timing of $T_{in}$ inputted to the Reset input and the rise timing of $FSO_{OUT1}$ inputted to the Clock input are disadvantageously proximate to each other in the D flip-flop circuit as shown in FIG. 13. When the malfunction (Meta stable) occurs, certain time is necessary for stabilizing the output of the D flip-flop circuit, disadvantageously causing a jitter. Therefore, the error propagation circuit part configured by employing only one D flip-flop circuit is not suitable for the higher-order TDC circuit.

Figure 14:
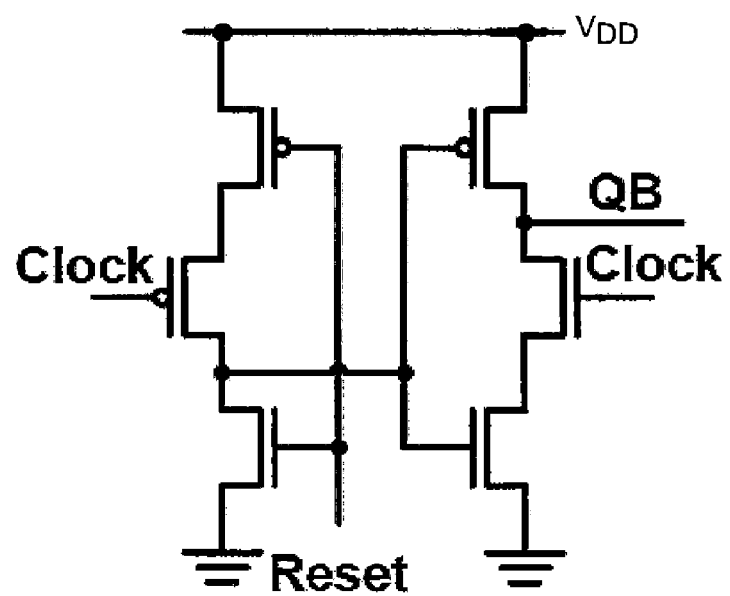
FIG. 14 is circuit configuration diagram of a dynamic type D flip-flop circuit.

Accordingly, in order to prevent the malfunction (Meta stable), the dynamic type D flip-flop circuit shown in FIG. 14 is employed. The dynamic type D flip-flop circuit, in which the data input of the D flip-flop circuit employed in the error propagation circuit part is always fixed to "High", can therefore be configured to include six transistors. The dynamic type D flip-flop circuit is a dynamic logic that scarcely causes the malfunction (Meta stable) and operates at higher speed than the master-slave type D flip-flop circuit.

Figure 15:
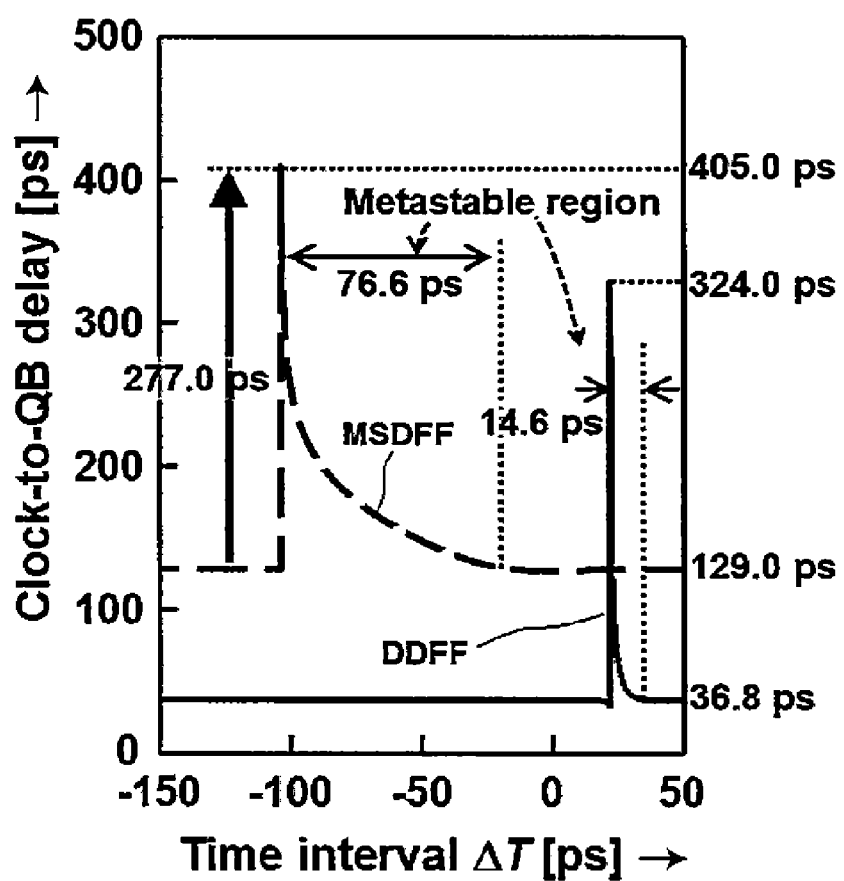
FIG. 15 is a Clock-to-QB delay characteristic graph of a master-slave type D flip-flop circuit and a dynamic type D flip-flop circuit.

Referring to FIG. 15, the Clock-to-QB delay characteristics of the master-slave type D flip-flop circuit (MSDFF) and the dynamic type D flip-flop circuit (DDFF) are plotted. In FIG. 15, ΔT denotes a time interval between the fall of a Reset input and the rise of a Clock input, and the malfunction (Meta stable) disadvantageously occurs when the two inputs are proximate to each other. It can be understood from FIG. 15 that the delay generated normally becomes 129 (ps) in the master-slave type D flip-flop circuit, and becomes 36.8 (ps) in the dynamic type D flip-flop circuit, meaning that the dynamic type D flip-flop circuit has about fourfold speed. However, either of the D flip-flop circuits has a region where the malfunction (Meta stable) disadvantageously occurs. The master-slave type D flip-flop circuit has an interval of 76.6 (ps), and the dynamic type D flip-flop circuit has an interval of 14.6 (ps), and this means that the dynamic type D flip-flop circuit has a shorter interval and a lower probability of the occurrence of the malfunction (Meta stable).

Figure 16:
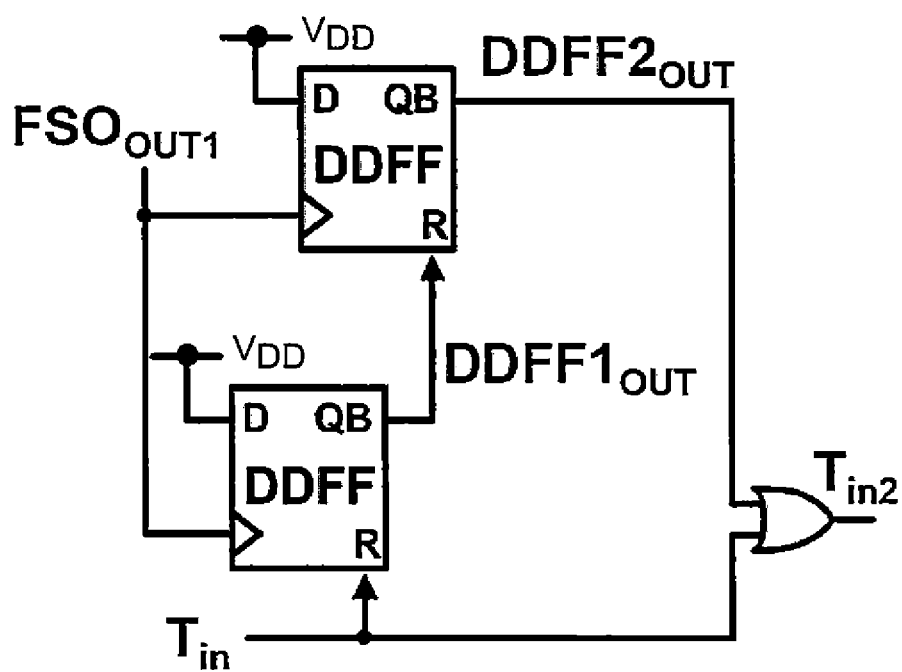
FIG. 16 is a circuit configuration diagram of a dynamic type D flip-flop circuit of a two-stage configuration.

However, in order to completely avoid the region of the malfunction (Meta stable), a dynamic type D flip-flop circuit of two-stage configuration is provided. The dynamic type D flip-flop circuit of two-stage configuration is shown in FIG. 16. The dynamic type D flip-flop circuit of two-stage configuration shown in FIG. 16 employs two dynamic type D flip-flop circuits and one OR logic. A timing diagram of an error propagation circuit configured to include the dynamic type D flip-flop circuit of two-stage configuration is shown in FIG. 17.

Figure 17:
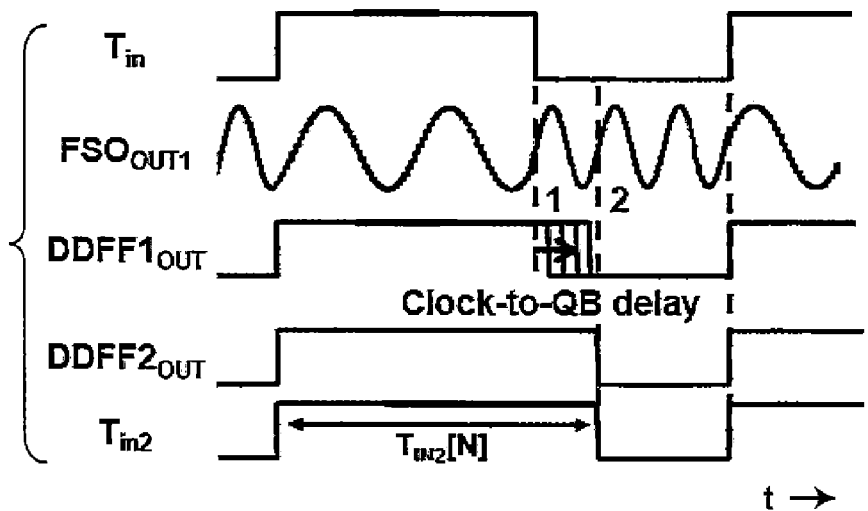
FIG. 17 is a timing diagram of a dynamic type D flip-flop circuit of the two-stage configuration.

Referring to FIG. 17, $DDFF1_{OUT}$ and $DDFF2_{OUT}$ represent outputs from the dynamic type D flip-flop circuit of the first stage, and the dynamic type D flip-flop circuit of the second stage, respectively. The malfunction (Meta stable) disadvantageously occurs in the $DDFF1_{OUT}$, and this delay is 324 (ps) at most (See FIG. 15) and converges within the oscillation period of the $FSO_{OUT1}$ (assumed to be oscillating at 900 MHz). With this arrangement, the influence of the malfunction (Meta stable) is not transmitted to the $DDFF2_{OUT}$, and it becomes possible to accurately transmit the quantization error component to the oscillator circuit of the succeeding stage.

Figure 18:
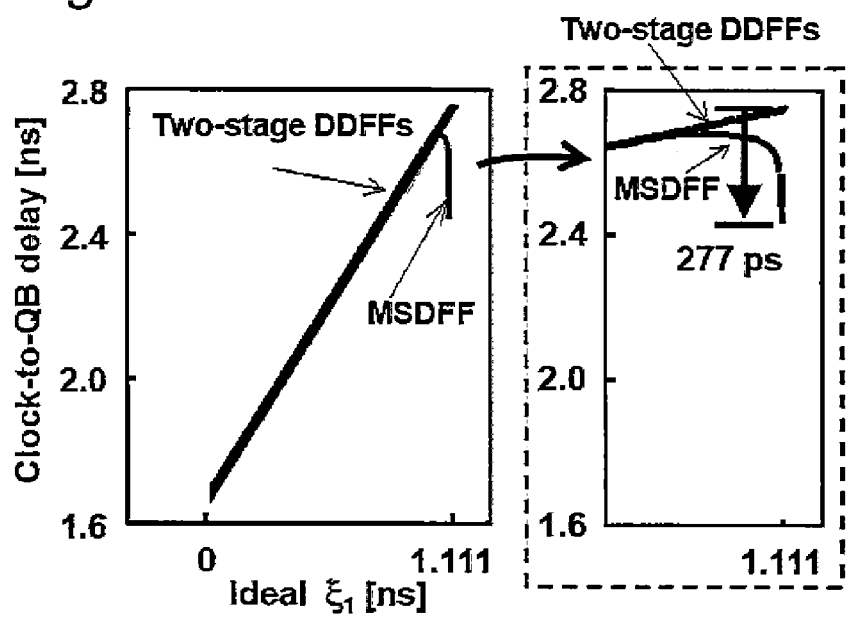
FIG. 18 shows quantization error propagation characteristics of the master-slave type D flip-flop circuit and the dynamic type D flip-flop circuit of the two-stage configuration.

FIG. 18 shows quantization error propagation characteristics of the master-slave type D flip-flop circuit and the dynamic type D flip-flop circuit of two-stage configuration. Both the quantization error propagation circuits keep roughly high linearity, and it can be confirmed that the malfunction (Meta stable) occurs when the quantization error ($ξ_1$) increases to a certain extent in the case of the master-slave type D flip-flop circuit, and an error of 277 (ps) is generated (corresponding to 277 (ps) of FIG. 15).

As described above, by connecting between the oscillator circuit parts with the circuit of interlinking two stages of D dynamic type flip-flop circuits in cascade, the influence of the malfunction (Meta stable) that occurs in the dynamic type D flip-flop circuit can be suppressed, and consequently accurate transmission of the time domain data becomes possible.

The present invention is useful for AD converters and TD converters. In improving the performance of the TD converter of the present invention, the analog components such as operational amplifiers and switched capacitors, which have conventionally been used for the AD converter, are not used at all. Therefore, adaptability to minute processes is high, and mounting in small areas is possible. The digital component circuit, for which a logic circuit can be utilized from the standard cell library, therefore this leads to a remarkable reduction in the amount of design or the designing period necessary for designing an AD converter, and it can be expected to reduce not only the chip area but also the design cost.

Moreover, the AD converter of the present invention, which has the architecture of high affinity to digital, is therefore very effective for combined analog/digital chips in the minute processes and allowed to be mounted at low cost. Therefore, applications to sensor networks and the like, which support the ubiquitous society, can be expected.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A TD converter apparatus for digitally converting a delay time value into a digital value, the TD converter apparatus comprising a plurality of M stages of TD converters which are connected in cascade,
   wherein each of the TD converters comprises:
   an oscillator circuit part configured to input time domain data;
   a first-state counter circuit part configured to measure a number of waves of an output oscillation waveform from the oscillator circuit part when time domain data is in a first state;
   a second-state counter circuit part configured to measure a number of waves of the output oscillation waveform from the oscillator circuit part when the time domain data is in a second state;
   an output signal generator part configured to generate an output signal based on output count values of the first-state counter circuit part and the second-state counter circuit part; and
   a frequency control circuit configured to control the oscillator circuit part to always oscillate and to control an oscillation frequency of the oscillator circuit part, and
   wherein the TD converter apparatus further comprises:
   an error propagation circuit part inserted between the oscillator circuit part of a preceding stage and the oscillator circuit part of a succeeding stage, the error propagation circuit part configured to take out delay information including a quantization error from phase information of the oscillator circuit part of the preceding stage, and propagate the taken-out delay information as time domain data of the succeeding stage to the oscillator circuit part of the succeeding stage; and
   an output signal generator part configured to generate an output signal based on output count values from the first-state counter circuit part of each stage and the second-state counter circuit part of each stage.

2. A TD converter for digitally converting a delay time value into a digital value, the TD converter comprising:
   an oscillator circuit part configured to input time domain data;
   a first-state counter circuit part configured to measure a number of waves of an output oscillation waveform from the oscillator circuit part when time domain data is in a first state;
   a second-state counter circuit part configured to measure a number of waves of the output oscillation waveform from the oscillator circuit part when the time domain data is in a second state;
   an output signal generator part configured to generate an output signal based on output count values of the first-state counter circuit part and the second-state counter circuit part; and
   a frequency control circuit configured to control the oscillator circuit part to always oscillate and to control an oscillation frequency of the oscillator circuit part,
   wherein the time domain data has the first state in which the data is in a High state, and the second state in which the data is in a Low state.

3. The TD converter apparatus as claimed in claim 1, wherein the time domain data has the first state in which the data is in a High state, and the second state in which the data is in a Low state.

4. A TD converter for digitally converting a delay time value into a digital value, the TD converter comprising:
   an oscillator circuit part configured to input time domain data;
   a first-state counter circuit part configured to measure a number of waves of an output oscillation waveform from the oscillator circuit part when time domain data is in a first state;
   a second-state counter circuit part configured to measure a number of waves of the output oscillation waveform from the oscillator circuit part when the time domain data is in a second state;
   an output signal generator part configured to generate an output signal based on output count values of the first-state counter circuit part and the second-state counter circuit part; and
   a frequency control circuit configured to control the oscillator circuit part to always oscillate and to control an oscillation frequency of the oscillator circuit part,
   wherein the frequency control circuit controls the oscillator frequency in two modes.

5. The TD converter apparatus as claimed in claim 1, wherein the frequency control circuit controls the oscillator frequency in two modes.

6. A TD converter for digitally converting a delay time value into a digital value, the TD converter comprising:
   an oscillator circuit part configured to input time domain data;
   a first-state counter circuit part configured to measure a number of waves of an output oscillation waveform from the oscillator circuit part when time domain data is in a first state;
   a second-state counter circuit part configured to measure a number of waves of the output oscillation waveform from the oscillator circuit part when the time domain data is in a second state;

an output signal generator part configured to generate an output signal based on output count values of the first-state counter circuit part and the second-state counter circuit part; and a frequency control circuit configured to control the oscillator circuit part to always oscillate and to control an oscillation frequency of the oscillator circuit part, wherein the oscillator circuit part includes a ring oscillator circuit, and wherein the frequency control circuit includes first and second current sources which are connected in parallel through a multiplexer with the ring oscillator circuit, the first current source being always connected through the multiplexer with the ring oscillator circuit, the second current source being connected through the multiplexer with the ring oscillator when the time domain data is inputted.

7. The TD converter apparatus as claimed in claim 1, wherein the oscillator circuit part includes a ring oscillator circuit, and wherein the frequency control circuit includes first and second current sources which are connected in parallel through a multiplexer with the ring oscillator circuit, the first current source being always connected through the multiplexer with the ring oscillator circuit, the second current source being connected through the multiplexer with the ring oscillator when the time domain data is inputted.

8. The TD converter apparatus as claimed in claim 1, wherein the error propagation circuit part includes at least two stages of dynamic type D flip-flop circuits which are connected in cascade.

9. The TD converter apparatus as claimed in claim 1, wherein the output signal generator part includes an LMS (Least Mean Square) filter circuit configured to estimate an oscillation frequency ratio between the oscillator circuit parts of adjacent stages based on the output count values from the first-state counter circuit part of each stage and the second-state counter circuit part of each stage.

10. An AD converter comprising:

a VT converter circuit part configured to input an analog input voltage and a sampling clock (CK), convert the analog input voltage into corresponding delay time, and outputs time domain data; and a TD converter configured to input the time domain data outputted from the VT converter circuit part, wherein the TD converter is configured to digitally convert a delay time value into a digital value, and the TD converter comprises:

an oscillator circuit part configured to input time domain data;

a first-state counter circuit part configured to measure a number of waves of an output oscillation waveform from the oscillator circuit part when time domain data is in a first state;

a second-state counter circuit part configured to measure a number of waves of the output oscillation waveform from the oscillator circuit part when the time domain data is in a second state;

an output signal generator part configured to generate an output signal based on output count values of the first-state counter circuit part and the second-state counter circuit part; and a frequency control circuit configured to control the oscillator circuit part to always oscillate and to control an oscillation frequency of the oscillator circuit part.

11. An AD converter comprising:

a VT converter circuit part configured to input an analog input voltage and a sampling clock (CK), convert the analog input voltage into corresponding delay time, and output time domain data; and a TD converter apparatus configured to input the time domain data outputted from the VT converter circuit part, wherein the TD converter apparatus configured to digitally convert a delay time value into a digital value, and the TD converter apparatus comprises a plurality of M stages of TD converters which are connected in cascade, wherein each of the TD converters comprises:

an oscillator circuit part configured to input time domain data;

a first-state counter circuit part configured to measure a number of waves of an output oscillation waveform from the oscillator circuit part when time domain data is in a first state;

a second-state counter circuit part configured to measure a number of waves of the output oscillation waveform from the oscillator circuit part when the time domain data is in a second state;

an output signal generator part configured to generate an output signal based on output count values of the first-state counter circuit part and the second-state counter circuit part; and a frequency control circuit configured to control the oscillator circuit part to always oscillate and to control an oscillation frequency of the oscillator circuit part, and wherein the TD converter apparatus further comprises:

an error propagation circuit part inserted between the oscillator circuit part of a preceding stage and the oscillator circuit part of a succeeding stage, the error propagation circuit part configured to take out delay information including a quantization error from phase information of the oscillator circuit part of the preceding stage, and propagate the taken-out delay information as time domain data of the succeeding stage to the oscillator circuit part of the succeeding stage; and an output signal generator part configured to generate an output signal based on output count values from the first-state counter circuit part of each stage and the second-state counter circuit part of each stage.

* * * * *